(12) United States Patent
Hamada

(10) Patent No.: US 8,721,054 B2
(45) Date of Patent: May 13, 2014

(54) LIQUID EJECTING HEAD, LIQUID EJECTING APPARATUS, AND PIEZOELECTRIC ELEMENT

(71) Applicant: Seiko Epson Corporation, Tokyo (JP)

(72) Inventor: Yasuaki Hamada, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/690,224

(22) Filed: Nov. 30, 2012

(65) Prior Publication Data

US 2013/0141496 A1 Jun. 6, 2013

(30) Foreign Application Priority Data

Dec. 1, 2011 (JP) ................. 2011-264138

(51) Int. Cl.
*B41J 2/045* (2006.01)

(52) U.S. Cl.
USPC .............................. 347/68; 347/71; 310/311

(58) Field of Classification Search
USPC ........ 347/68–72; 310/311, 358; 252/62.9 PZ; 29/25.35
See application file for complete search history.

(56) References Cited

U.S. PATENT DOCUMENTS

| 7,586,234 | B2 | 9/2009 | Miyazawa et al. |
| 2002/0126185 | A1 | 9/2002 | Murai |
| 2007/0241642 | A1 | 10/2007 | Miyazawa et al. |
| 2008/0018716 | A1 | 1/2008 | Noguchi et al. |
| 2009/0026887 | A1 | 1/2009 | Fujii et al. |
| 2009/0243438 | A1 | 10/2009 | Hamada et al. |
| 2011/0090289 | A1 | 4/2011 | Mizukami |
| 2011/0101828 | A1 | 5/2011 | Noda et al. |
| 2012/0086758 | A1 | 4/2012 | Hamada et al. |
| 2013/0056671 | A1* | 3/2013 | Kubota et al. .......... 252/62.9 PZ |

FOREIGN PATENT DOCUMENTS

| JP | 2001-223404 | 8/2001 |
| JP | 2007-287745 | 11/2007 |
| JP | 2008-028030 | 2/2008 |
| JP | 2009-252790 | 10/2009 |
| JP | 2011-091138 | 5/2011 |
| JP | 2012-018944 | 1/2012 |
| WO | 2009-157189 | 12/2009 |

OTHER PUBLICATIONS

Potrepka, Daniel M. et al., Optimization of PZT Thin Film Crystalline Orientation Through Optimization of TiO2/Pt Templates, dated Jan. 2011, pp. 1-48.

* cited by examiner

*Primary Examiner* — Henok Legesse
(74) *Attorney, Agent, or Firm* — Harness, Dickey & Pierce, P.L.C.

(57) ABSTRACT

A liquid ejecting head which discharges a liquid from nozzle openings includes: a piezoelectric element which is provided with a piezoelectric layer and an electrode provided on the piezoelectric layer, and the piezoelectric layer is formed of a complex oxide having a perovskite structure which contains bismuth, iron, barium, titanium, and at least one selected from the group consisting of copper, nickel, and zinc.

5 Claims, 14 Drawing Sheets

0.1 mm 0.1 mm 0.1 mm 0.1 mm 0.1 mm

EXAMPLE 1

EXAMPLE 2

EXAMPLE 3

COMPARATIVE EXAMPLE 1

EXAMPLE 2

EXAMPLE 4

LIQUID EJECTING HEAD, LIQUID EJECTING APPARATUS, AND PIEZOELECTRIC ELEMENT

The entire disclosure of Japanese Patent Application No. 2011-264138, filed Dec. 1, 2011 is incorporated by reference herein.

BACKGROUND

1. Technical Field

The present invention relates to a liquid ejecting head which is provided with a piezoelectric element having a piezoelectric layer made of a piezoelectric material and an electrode and discharges liquid droplets from nozzle openings, a liquid ejecting apparatus, and a piezoelectric element.

2. Related Art

Some piezoelectric elements which are used in liquid ejecting heads have a configuration in which a piezoelectric layer made of a piezoelectric material having an electromechanical transduction function, such as a crystallized dielectric material, is sandwiched between two electrodes. Such a piezoelectric element is mounted on a liquid ejecting head as, for example, a flexural oscillation-mode actuator device. Here, representative examples of the liquid ejecting head include an ink jet recording head in which a part of a pressure generating chamber communicating with nozzle openings which discharge ink droplets is formed by an oscillation plate and the oscillation plate is deformed by a piezoelectric element to pressurize the ink in the pressure generating chamber, thereby discharging ink droplets from the nozzle openings.

A piezoelectric material which is used as a piezoelectric layer of the piezoelectric element is required to have high piezoelectric characteristics, and representative examples of the piezoelectric material include lead zirconate titanate (PZT) (see JP-A-2001-223404). However, a piezoelectric material which is lead-free or in which the content of lead is suppressed is demanded from the viewpoint of environmental problems. Examples of the piezoelectric material containing no lead include $BiFeO_3$-based piezoelectric materials containing Bi and Fe (for example, see JP-A-2007-287745).

However, when a bismuth ferrate-based piezoelectric layer having a perovskite structure is manufactured, there is a problem in that cracks are easily caused. This problem occurs not only in ink jet recording heads, but also in other liquid ejecting heads which discharge liquid droplets other than ink, and piezoelectric elements being used in devices other than the liquid ejecting head also have this problem.

SUMMARY

An advantage of some aspects of the invention is that it provides a liquid ejecting head which is adapted to reduce the burden on the environment and to suppress cracks from being caused, a liquid ejecting apparatus, and a piezoelectric element.

According to an aspect of the invention, there is provided a liquid ejecting head which discharges a liquid from nozzle openings, including: a piezoelectric element which is provided with a piezoelectric layer and an electrode provided on the piezoelectric layer, in which the piezoelectric layer is formed of a complex oxide having a perovskite structure which contains bismuth, iron, barium, titanium, and at least one selected from the group consisting of copper, nickel, and zinc.

In this aspect, since the piezoelectric layer is formed of a complex oxide having a perovskite structure which contains at least one selected from the group consisting of copper, nickel, and zinc, cracks can be suppressed from being caused in the piezoelectric layer. In addition, since no lead may be contained, or the content of lead is suppressed, the burden on the environment can be reduced.

It is preferable that the complex oxide contains bismuth, iron, barium, titanium, copper, and manganese. According to this aspect, cracks can be suppressed from being caused in the piezoelectric layer and leak characteristics can be improved.

According to another aspect of the invention, there is provided a liquid ejecting apparatus including: the liquid ejecting head.

In this aspect, since the piezoelectric element, adapted to reduce the burden on the environment and to suppress cracks from being caused, is provided, a liquid ejecting apparatus having excellent reliability can be realized.

According to a further aspect of the invention, there is provided a piezoelectric element including: a piezoelectric layer; and an electrode which is provided on the piezoelectric layer, in which the piezoelectric layer is formed of a complex oxide having a perovskite structure which contains bismuth, iron, barium, titanium, and at least one selected from the group consisting of copper, nickel, and zinc.

In this aspect, cracks can be suppressed from being caused in the piezoelectric layer. In addition, since no lead may be contained, or the content of lead is suppressed, the burden on the environment can be reduced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiment 1

Figure 1:
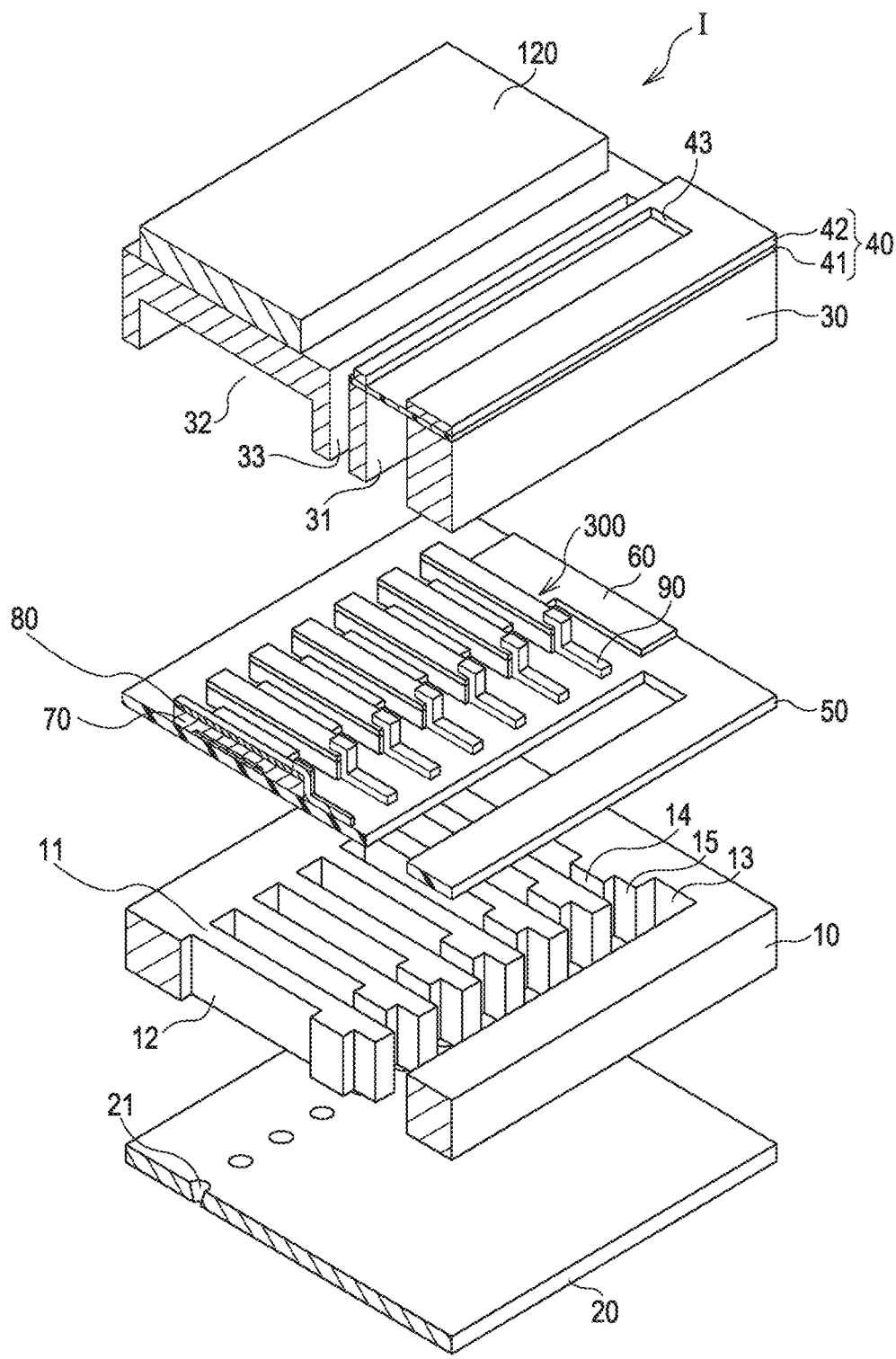
FIG. 1 is an exploded perspective view schematically illustrating the configuration of a recording head according to Embodiment 1.
Figure 2A:
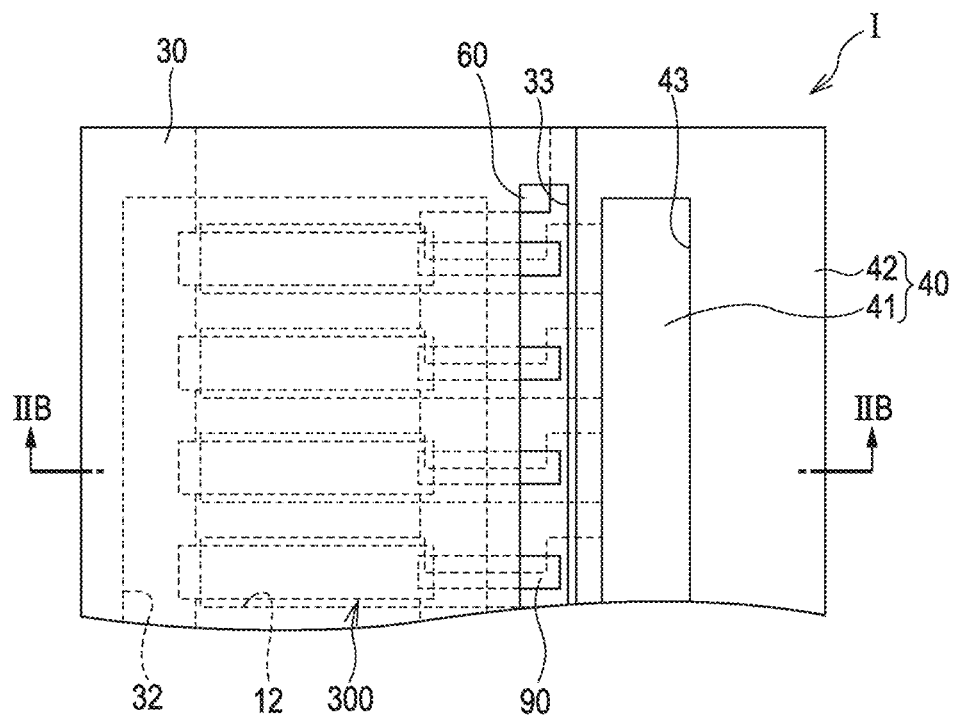
FIGS. 2A and 2B are a plan view and a cross-sectional view, respectively, illustrating the recording head according to Embodiment 1.

FIG. 1 is an exploded perspective view schematically illustrating the configuration of an ink jet recording head as an example of a liquid ejecting head according to Embodiment 1 of the invention. FIG. 2A is a plan view of FIG. 1 and FIG. 2B is a cross-sectional view, taken along the line IIB-IIB of FIG. 1.

Figure 2B:
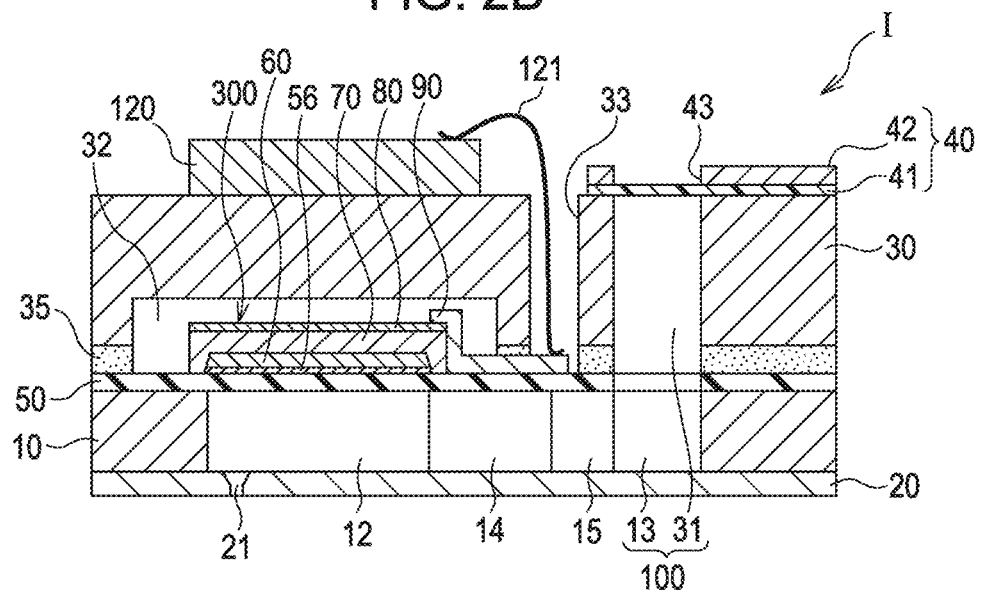

As shown in FIGS. 1, 2A, and 2B, a flow path forming substrate 10 of this embodiment is formed of a single-crystal silicon substrate, and has an elastic film 50 made of silicon dioxide on one surface thereof.

The flow path forming substrate 10 has a plurality of pressure generating chambers 12 arranged in parallel in the width direction thereof. In addition, a communicating portion 13 is formed in an area which is outside the pressure generating chamber 12 of the flow path forming substrate 10 in the longitudinal direction, and the communicating portion 13 and each pressure generating chamber 12 communicate with each other via an ink supply path 14 and a communicating path 15 provided for each pressure generating chamber 12. The communicating portion 13 communicates with a manifold portion 31 of a protective substrate to be described later, and constitutes a part of a manifold acting as a common ink chamber for the pressure generating chambers 12. The ink supply path 14 is formed to have a width narrower than that of the pressure generating chamber 12, and maintains the flow path resistance of the ink flowing into the pressure generating chamber 12 from the communicating portion 13. In this embodiment, although the ink supply path 14 is formed by narrowing the width of the flow path from one side, the ink supply path may be formed by narrowing the width of the flow path from both sides. In addition, the ink supply path may be formed by narrowing in the thickness direction, not by narrowing the width of the flow path. In this embodiment, the flow path forming substrate 10 is provided with liquid flow paths formed of the pressure generating chambers 12, the communicating portion 13, the ink supply paths 14 and the communicating paths 15.

In addition, a nozzle plate 20 which has nozzle openings 21 bored therethrough and communicating with the vicinity of end portions of the respective pressure generating chambers 12 on the opposite sides to the ink supply paths 14 is fixed to the opening surface side of the flow path forming substrate 10 by an adhesive, a thermal welding film or the like. The nozzle plate 20 is formed of, for example, glass ceramics, a single-crystal silicon substrate, stainless steel, or the like.

As described above, the elastic film 50 is formed on the opposite side to the opening surface of the flow path forming substrate 10, and, for example, an adhesion layer 56 made of titanium oxide or the like which has a thickness of about 30 nm to 50 nm for improving the adhesion with the base of a first electrode 60 of the elastic film 50 or the like is provided on the elastic film 50. An insulating film made of zirconium oxide or the like may be provided on the elastic film 50 as necessary.

Furthermore, the first electrode 60, a piezoelectric layer 70, which is a thin film having a thickness of 3 μm or less, and preferably 0.3 μm to 1.5 μm, and a second electrode 80 are formed and laminated on the adhesion layer 56, thereby constituting a piezoelectric element 300 as a pressure generator which causes a change in pressure in the pressure generating chamber 12. Here, the piezoelectric element 300 is a part including the first electrode 60, the piezoelectric layer 70, and the second electrode 80. Generally, one electrode of the piezoelectric element 300 acts as a common electrode and the other electrode and the piezoelectric layer 70 are configured for each pressure generating chamber 12 by patterning. In this embodiment, the first electrode 60 is a common electrode for the piezoelectric element 300 and the second electrode 80 is an individual electrode of the piezoelectric element 300. However, even when they switch their roles, there is no problem due to the circumstances of the driving circuit and wiring. In addition, here, the piezoelectric element 300 and an oscillation plate which is displaced by driving of the piezoelectric element 300 are collectively referred to as an actuator device. In the above-described examples, although the elastic film 50, the adhesion layer 56, the first electrode 60, and the insulating film which is provided as necessary act as an oscillation plate, the invention is not limited thereto. For example, the elastic film 50 and the adhesion layer 56 may not be provided. In addition, the piezoelectric element 300 itself may also substantially act as an oscillation plate.

In addition, in this embodiment, a piezoelectric material constituting the piezoelectric layer 70 is a complex oxide having a perovskite structure which contains bismuth (Bi), iron (Fe), barium (Ba), titanium (Ti), and at least one selected from the group consisting of copper (Cu), nickel (Ni), and zinc (Zn). The A-site of the perovskite structure, i.e., an $ABO_3$ structure is coordinated with 12 oxygen atoms, and the B-site is coordinated with 6 oxygen atoms, thereby forming an octahedron. Bi and Ba are positioned in the A-site, and Fe and Ti are positioned in the B-site. In addition, it is presumed that at least one element selected from the group consisting of copper (Cu), nickel (Ni), and zinc (Zn) is a complex oxide which is positioned in the B-site and has a structure in which some Fe atoms present in the B-site are substituted.

Such a complex oxide having a perovskite structure which contains Bi, Fe, Ba, Ti, and at least one selected from the group consisting of Cu, Ni, and Zn is a complex oxide having a perovskite structure of mixed crystals almost entirely of bismuth ferrate and barium titanate, and contains at least one selected from the group consisting of small amounts of copper, nickel, and zinc. In the X-ray diffraction pattern, bismuth ferrate and barium titanate are not independently detected. As above, in the complex oxide of a system represented as mixed crystals of bismuth ferrate and barium titanate which contains Bi, Fe, Ba, and Ti, at least one of copper, nickel, and zinc is contained, and thus residual stress can be reduced and cracks can be suppressed from being caused at the time of manufacturing.

Here, the complex oxide may contain any one or more of copper, nickel, and zinc, or contain them in combination. Regarding the complex oxide, it is preferable that the ratio of the total molar quantity of copper, nickel, and zinc to the total molar quantity of the B-site elements (total molar quantity of iron, titanium, copper, nickel, and zinc) is 2 mol % to 10 mol %. Accordingly, cracks can be more securely suppressed from being caused. When the ratio is less than 2 mol %, there is concern that the crack suppression effect may not be sufficiently obtained, and when the ratio is greater than 10 mol %, there is concern that leak characteristics may be deteriorated.

In addition, bismuth ferrate and barium titanate are well-known piezoelectric materials having a perovskite structure, and various compositions thereof are known. Examples thereof include a composition in which a ratio of the total molar quantity of bismuth and barium to the total molar quantity of iron, titanium, and M, i.e., (Bi+Ba)/(Fe+Ti+M) is 1.0. M is at least one selected from copper, nickel, and zinc. However, as described above, as long as the perovskite structure can be taken, compositional deviation due to lattice mismatch, loss of some elements, or the like and substitution of some elements are allowed, and when the stoichiometric ratio is 1, compositions with a stoichiometric ratio of 0.85 to 1.20 are allowed.

In addition, the complex oxide constituting the piezoelectric layer 70 may contain elements other than Bi, Fe, Ba, Ti, and at least one element selected from Cu, Ni, and Zn in order to improve desired characteristics. Examples of other elements include Mn and Co, and any of Mn and Co may be contained. In the case of a complex oxide containing other elements, it is also necessary to have the perovskite structure.

When the piezoelectric layer 70 contains Mn or Co, it is presumed that the piezoelectric layer 70 is a complex oxide having a structure in which Mn or Co is positioned in the B-site and some Fe atoms present in the B-site are substituted with Mn or Co. At this time, it is preferable that the complex oxide constituting the piezoelectric layer 70 has a perovskite structure containing Bi, Fe, Ba, Ti, and Cu. In other words, it is preferable that when containing Mn or Co, the complex oxide contains Cu among Cu, Ni, and Zn. The reason for this is that cracks are suppressed from being caused and leak characteristics can be improved. For example, when containing Mn, the complex oxide constituting the piezoelectric layer 70 has the same basic characteristics as a complex oxide having a perovskite structure formed of Bi, Fe, Ba, Ti, and Cu, but has improved leak characteristics. In addition, when containing Co, leak characteristics are improved as in the case of containing Mn. When using Ni or Zn and Mn in combination, there is concern that the effect of suppressing cracks from being caused may be reduced.

In addition, although the description has been given with Mn and Co as examples, it is found that the leak characteristics are improved also in the case of containing other transition metal elements such as Cr and in the case of containing two or more types of the transition elements at the same time. These can be used as the piezoelectric layer 70 and other well-known additives may be contained to improve the characteristics. At this time, regarding the complex oxide, it is preferable that the molar quantity of Mn or the like with respect to the total molar quantity of the B-site elements (total molar quantity of iron, titanium, copper, and manganese) is 1 mol % to 10 mol %. Accordingly, leak characteristics can be more securely improved. When the ratio is less than 1 mol %, or greater than 10 mol %, there is concern that the effect of improving the leak characteristics may not be sufficiently obtained.

In this embodiment, the piezoelectric layer is formed of a complex oxide having a perovskite structure which contains Bi, Fe, Ba, Ti, Cu, and Mn.

The piezoelectric layer 70 may be oriented to any of the (110), (100), and (111) planes, or may not be preferentially oriented, and is not particularly limited.

Each second electrode 80 which is an individual electrode of the piezoelectric element 300 is connected to a lead electrode 90 made of, for example, gold (Au) which protrudes from the vicinity of an end portion on the side of the ink supply path 14 and extends onto the elastic film 50 or onto the insulating film which is provided as necessary.

A protective substrate 30 having the manifold portion 31 which constitutes at least a part of a manifold 100 is bonded on the flow path forming substrate 10 having the piezoelectric element 300 formed thereon, that is, on the first electrode 60, the elastic film 50, the insulating film which is provided as necessary, and the lead electrode 90 through an adhesive 35. In this embodiment, the manifold portion 31 is formed to penetrate the protective substrate 30 in the thickness direction over the pressure generating chamber 12 in the width direction, and communicates with the communicating portion 13 of the flow path forming substrate 10 as described above, thereby constituting the manifold 100 which is a common ink chamber for the pressure generating chambers 12. In addition, the communicating portion 13 of the flow path forming substrate 10 may be divided into more than one for each pressure generating chamber 12 so that only the manifold portion 31 may act as a manifold. Furthermore, for example, the flow path forming substrate 10 may be provided with only the pressure generating chambers 12, and the ink supply path 14 communicating with the manifold 100 and each pressure generating chamber 12 may be provided as a member (for example, the elastic film 50, the insulating film which is provided as necessary, and the like) interposed between the flow path forming substrate 10 and the protective substrate 30.

In addition, a piezoelectric element holding portion 32 which has a space so as not to disturb the operation of the piezoelectric element 300 is provided in an area in the protective substrate 30 which is opposed to the piezoelectric element 300. The piezoelectric element holding portion 32 may have a space so as not to disturb the operation of the piezoelectric element 300, and the space may be sealed or may not be sealed.

It is preferable that a material having substantially the same coefficient of thermal expansion as the flow path forming substrate 10, such as glass or a ceramic material, is used as the protective substrate 30. In this embodiment, the protective substrate 30 is formed using a single-crystal silicon substrate which is the same material as the flow path forming substrate 10.

In addition, the protective substrate 30 is provided with a through hole 33 which penetrates the protective substrate 30 in the thickness direction. The vicinity of an end portion of the lead electrode 90 protruding from each piezoelectric element 300 is provided to be exposed inside the through hole 33.

In addition, a driving circuit 120 for driving the juxtaposed piezoelectric elements 300 is fixed on the protective substrate 30. For example, a circuit board, a semiconductor integrated circuit (IC) or the like can be used as the driving circuit 120. The driving circuit 120 and the lead electrode 90 are electrically connected to each other via a connection wire 121 formed of a conductive wire such as a bonding wire.

In addition, a compliance substrate 40 formed of a sealing film 41 and a fixing plate 42 is bonded on the protective substrate 30. Here, the sealing film 41 is made of a flexible material having low hardness, and one surface of the manifold portion 31 is sealed with the sealing film 41. In addition, the fixing plate 42 is made of a material which is relatively hard. In an area in the fixing plate 42 which is opposed to the manifold 100, an opening portion 43 which is completely removed in the thickness direction is formed, and thus one surface of the manifold 100 is sealed only with the flexible sealing film 41.

In an ink jet recording head I of this embodiment, ink is introduced from an ink introduction port connected to an exterior ink supplier (not shown) and fills the inside from the manifold 100 to the nozzle openings 21. Then, a voltage is applied between the first electrode 60 and the second electrode 80 corresponding to the pressure generating chamber 12 in accordance with a recording signal from the driving circuit 120, and the elastic film 50, the adhesion layer 56, the first electrode 60, and the piezoelectric layer 70 are subjected to flexural deformation, thereby increasing the pressure in each pressure generating chamber 12 and discharging ink droplets from the nozzle openings 21.

Next, an example of a method of manufacturing the ink jet recording head of this embodiment will be described with reference to FIGS. 3A to 7B. FIGS. 3A to 7B are cross-sectional views of the pressure generating chamber in the longitudinal direction (second direction).

Figure 3A:
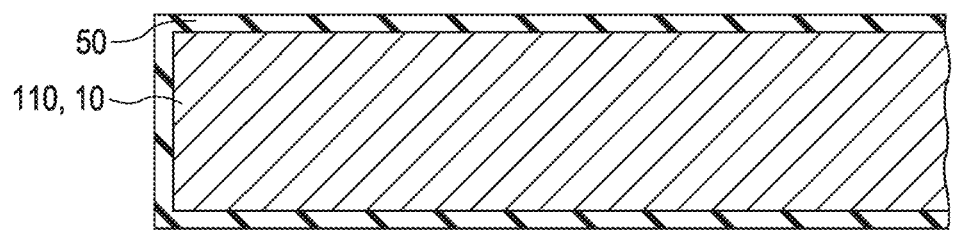
FIGS. 3A and 3B are cross-sectional views illustrating a process of manufacturing the recording head according to Embodiment 1.
Figure 3B:
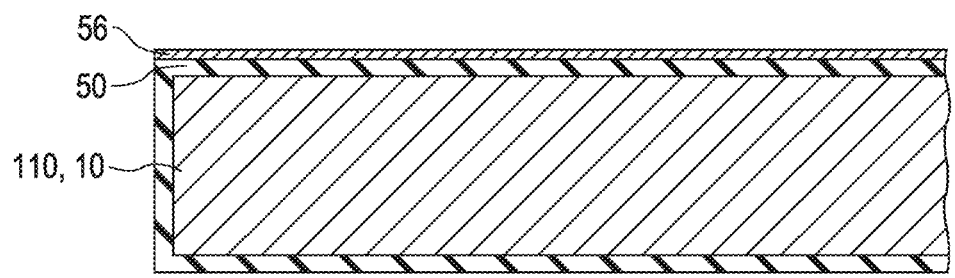

First, as shown in FIG. 3A, a silicon dioxide film made of silicon dioxide ($SiO_2$) or the like which constitutes the elastic film 50 is formed on a surface of a wafer 110 for the flow path forming substrate which is a silicon wafer by thermal oxidation or the like. Next, as shown in FIG. 3B, the adhesion layer 56 made of titanium oxide or the like is formed on the elastic film 50 (silicon dioxide film) by a sputtering method, a thermal oxidation method or the like.

Figure 4A:
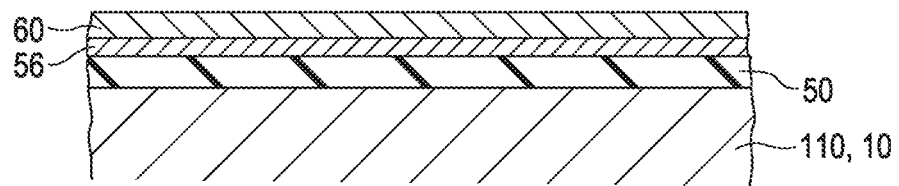
FIGS. 4A to 4C are cross-sectional views illustrating a process of manufacturing the recording head according to Embodiment 1.
Figure 4B:
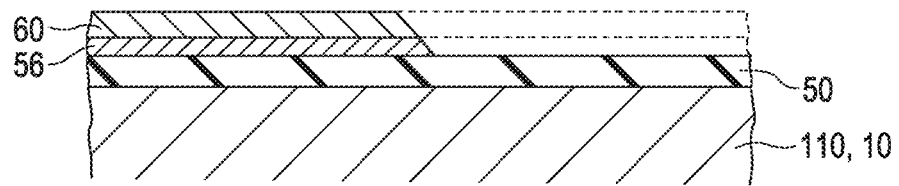

Next, as shown in FIG. 4A, the first electrode 60 is formed over the entire surface of the adhesion layer 56. Specifically, the first electrode 60 made of, for example, platinum, iridium, iridium oxide, or having a lamination structure thereof is formed on the adhesion layer 56 by a sputtering method or a deposition method. Next, as shown in FIG. 4B, using a resist (not shown) having a predetermined shape as a mask on the first electrode 60, patterning is performed on the adhesion layer 56 and the first electrode 60 at the same time so that side surfaces thereof are inclined.

Next, the resist is peeled off, and then the piezoelectric layer 70 is laminated on the first electrode 60 (and the adhesion layer 56).

The method of manufacturing the piezoelectric layer 70 is not particularly limited. However, for example, it is possible to use a chemical solution deposition method such as a sol-gel method or a Metal-Organic Decomposition (MOD) method in which a solution obtained by dissolving and dispersing a metal complex containing, for example, Bi, Fe, Mn, Ba, Ti, and at least one selected from the group consisting of Cu, Ni, and Zn in a solvent is applied and dried, and further baked at high temperature to obtain a piezoelectric layer (piezoelectric film) made of metal oxide. The piezoelectric layer 70 can also be manufactured by a gas phase method, a solid phase method, or a liquid phase method such as a sputtering method, a Pulsed Laser Deposition method (PLD method), a CVD method, or an aerosol deposition method.

Figure 4C:
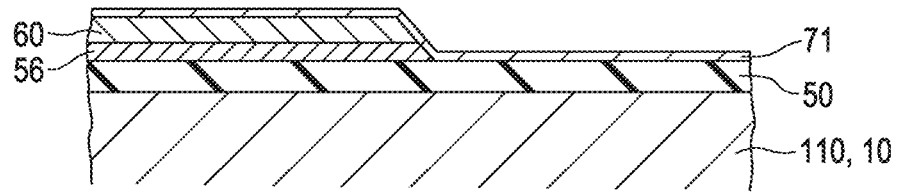

In this embodiment, the piezoelectric layer 70 is manufactured using a chemical solution deposition method such as a MOD method or a sol-gel method. Specifically, first, as shown in FIG. 4C, a sol or a MOD solution (precursor solution) which includes a metal complex containing Bi, Fe, Mn, Ba, Ti, and at least one selected from the group consisting of Cu, Ni, and Zn at a predetermined ratio is applied to the first electrode 60 using a spin coat method or the like to form a piezoelectric precursor film 71 (application process).

As in this embodiment, when forming the piezoelectric layer 70 which is formed of a complex oxide having a perovskite structure which contains bismuth, iron, manganese, barium, titanium, and copper, the precursor solution to be applied is a solution obtained by dissolving or dispersing a metal complex mixture, which can form a complex oxide containing bismuth, iron, manganese, barium, titanium, and copper by baking, in an organic solvent. The metal complex mixture is a mixture of metal complexes containing one or more of metals constituting the complex oxide, and the metal complexes are mixed so that the respective metals, i.e., Bi, Fe, Mn, Ba, Ti, and Cu are present with a desired molar ratio. That is, in this embodiment, the mixing ratio of the metal complexes containing Bi, Fe, Mn, Ba, Ti, and Cu is a ratio for making a complex oxide in which the respective metals, that is, Bi, Fe, Mn, Ba, Ti, and Cu satisfy a desired composition ratio.

Here, examples of the metal complexes respectively containing Bi, Fe, Mn, Ba, Ti, Cu, Ni, and Zn include alkoxide, organic salt, and a β-diketone complex. Examples of the metal complex containing Bi include bismuth 2-ethylhexanoate and bismuth acetate. Examples of the metal complex containing Fe include iron acetylacetonate, 2-ethylhexanoate, and iron acetate. Examples of the metal complex containing Mn include manganese acetylacetonate, manganese 2-ethylhexanoate, and manganese acetate. Examples of the metal complex containing Ba include barium isopropoxide, barium 2-ethylhexanoate, and barium acetylacetonate. Examples of the metal complex containing Ti include titanium isopropoxide, titanium 2-ethylhexanoate, and titanium(di-1-propoxide)bis(acetylacetonate). Examples of the metal complex containing Cu include copper acetylacetonate and copper 2-ethylhexanoate. Examples of the metal complex containing Ni include nickel acetylacetonate and nickel 2-ethylhexanoate. Examples of the metal complex containing Zn include zinc acetylacetonate and zinc 2-ethylhexanoate. A metal complex containing two or more of Bi, Fe, Mn, Ba, Ti, Cu, Ni, and Zn may also be used.

In addition, the solvent may be any solvent which dissolves or disperses the metal complex mixture, and although not particularly limited, various solvents such as toluene, xylene, octane, ethylene glycol, 2-methoxyethanol, butanol, ethanol, isopropyl alcohol, acetic acid, and water may be employed. Two or more of these examples may also be used.

Next, the piezoelectric precursor film 71 is heated at a predetermined temperature (for example, 130° C. to 200° C.) and dried for a given time (drying process). Next, the dried piezoelectric precursor film 71 is heated at a predetermined temperature (for example, 350° C. to 450° C.) and held for a given time to be degreased (degreasing process). The "degreasing" mentioned here refers to separating an organic component contained in the piezoelectric precursor film 71 as, for example, $NO_2$, $CO_2$, and $H_2O$. The atmosphere of the drying process or the degreasing process is not limited, and may be air, an oxygen atmosphere, or an inert gas atmosphere. In addition, the application process, the drying process, and the degreasing process may be performed a plurality of times.

Figure 5A:
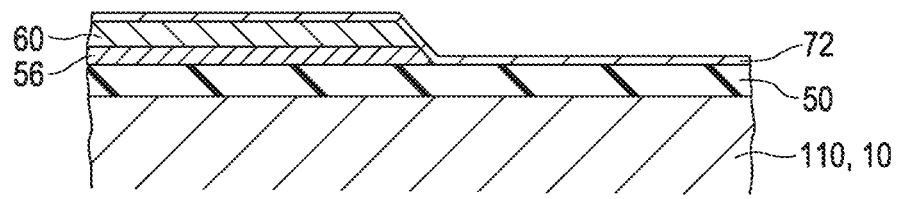
FIGS. 5A and 5B are cross-sectional views illustrating a process of manufacturing the recording head according to Embodiment 1.

Next, as shown in FIG. 5A, the piezoelectric precursor film 71 is heated at a predetermined temperature, for example, a temperature of about 600° C. to 850° C. and held for a given time, for example, 1 to 10 minutes to be crystallized, thereby forming a piezoelectric film 72 formed of a complex oxide which contains bismuth, barium, iron, titanium, and at least one selected from the group consisting of copper, nickel, and zinc (baking process). Even in this baking process, the atmosphere is not limited, and may be air, an oxygen atmosphere, or an inert gas atmosphere.

As a heating apparatus which is used in the drying process, the degreasing process, and the baking process, for example, a Rapid Thermal Annealing (RTA) apparatus which performs heating by illumination of an infrared lamp, or a hot plate is used.

Figure 5B:
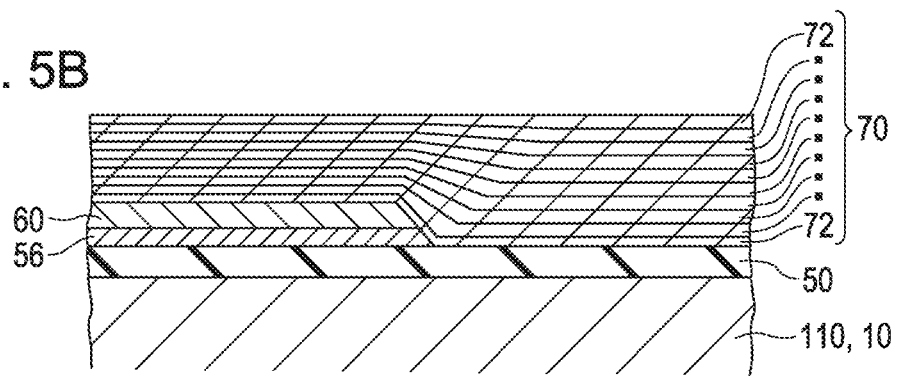

Next, after peeling off the resist, the application process, the drying process, and the degreasing process described above, or the application process, the drying process, the degreasing process, and the baking process are repeated a plurality of times in accordance with a desired thickness and the like to form a plurality of the piezoelectric films 72, whereby the piezoelectric layer 70 having a predetermined thickness which is formed of the plurality of piezoelectric films 72 as shown in FIG. 5B is formed. In the formation of the plurality of piezoelectric films 72, the application process, the drying process, the degreasing process, and the baking process may be sequentially performed for laminating, or the application process, the drying process, and the degreasing process may be repeatedly performed, and then a plurality of the layers may be arranged and baked. In this embodiment, the piezoelectric layer 70 is provided by laminating the piezoelectric films 72, but may also have only a single piezoelectric film 72.

After forming the piezoelectric layer 70 as described above, as shown in FIG. 6A, the second electrode 80 made of platinum or the like is formed on the piezoelectric layer 70 by a sputtering method or the like, and patterning is simultaneously performed on the piezoelectric layer 70 and the second electrode 80 on an area opposed to each pressure generating chamber 12, thereby forming the piezoelectric element 300 formed of the first electrode 60, the piezoelectric layer 70, and the second electrode 80. The patterning of the piezoelectric layer 70 and the second electrode 80 can be collectively performed by performing dry etching via a resist (not shown) formed into a predetermined shape. Thereafter, postannealing may be performed in a temperature range of 600° C. to 800° C. as necessary. Accordingly, a favorable interface can be formed between the piezoelectric layer 70 and the first electrode 60 or the second electrode 80, and crystalline properties of the piezoelectric layer 70 can be improved.

Figure 6A:
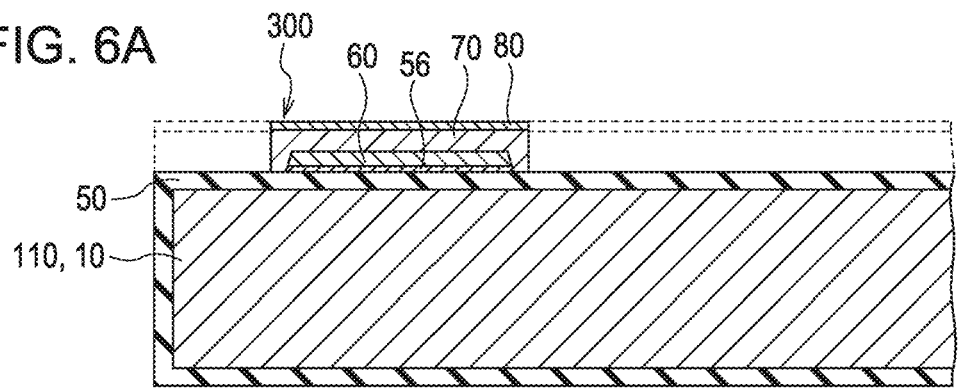
FIGS. 6A to 6C are cross-sectional views illustrating a process of manufacturing the recording head according to Embodiment 1.
Figure 6B:
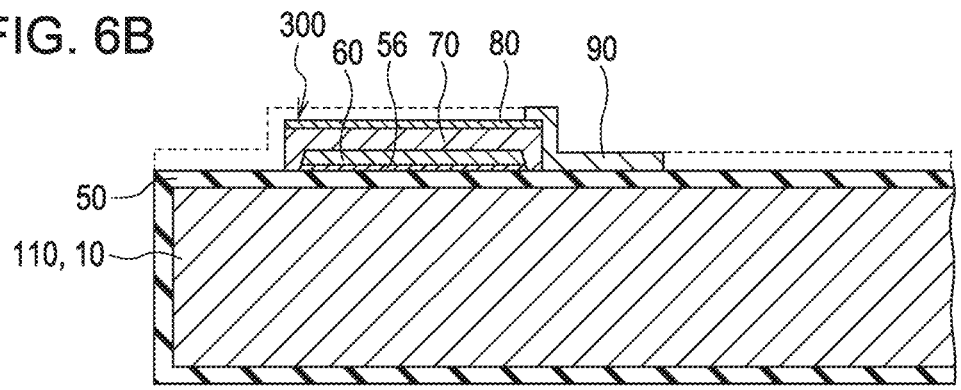

Next, as shown in FIG. 6B, the lead electrode 90 made of, for example, gold (Au) is formed over the entire surface of the wafer 110 for the flow path forming substrate, and thereafter, patterning is performed on each piezoelectric element 300 via, for example, a mask pattern (not shown) formed of a resist or the like.

Figure 6C:
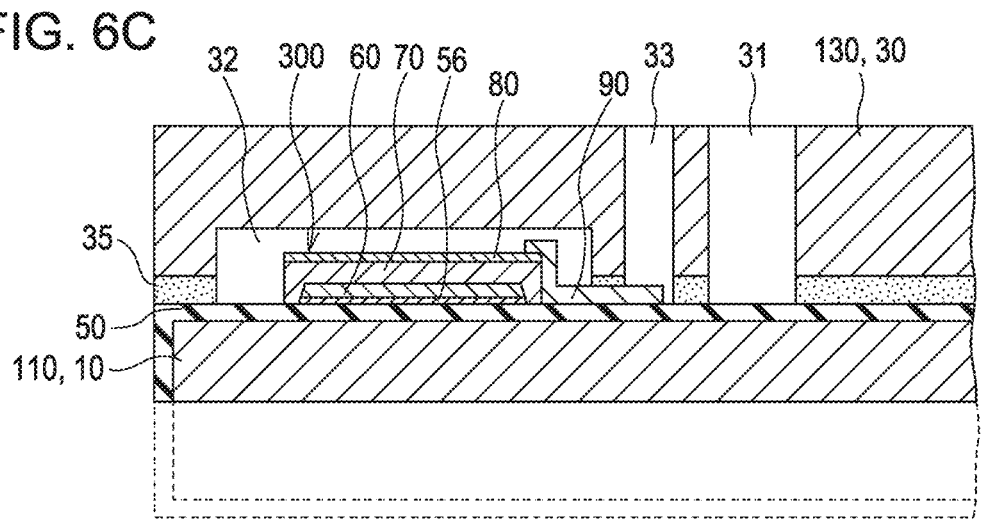

Next, as shown in FIG. 6C, a wafer 130 for the protective substrate which is a silicon wafer and is to be a plurality of the protective substrates 30 is bonded via the adhesive 35 on the side of the piezoelectric element 300 of the wafer 110 for the flow path forming substrate, and thereafter, the wafer 110 for the flow path forming substrate is made thin to have a predetermined thickness.

Figure 7A:
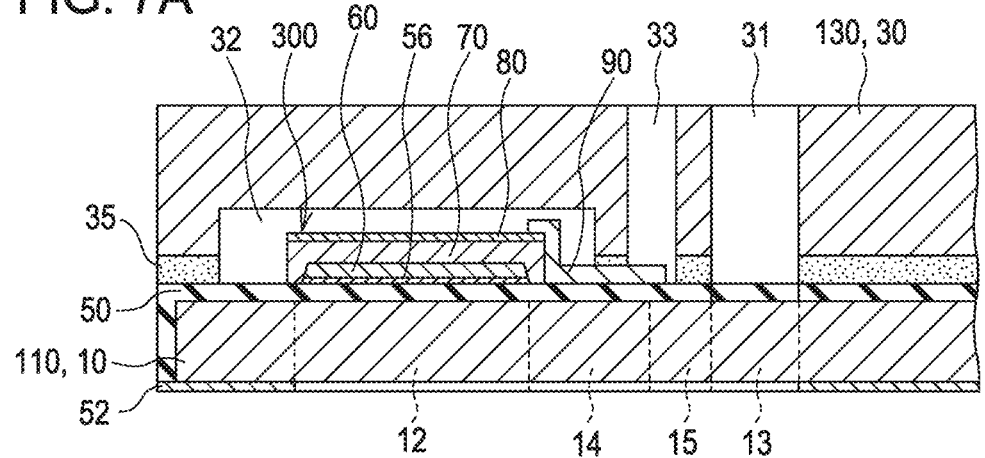
FIGS. 7A and 7B are cross-sectional views illustrating a process of manufacturing the recording head according to Embodiment 1.

Next, as shown in FIG. 7A, a mask film 52 is newly formed on the wafer 110 for the flow path forming substrate and is patterned into a predetermined shape.

Figure 7B:
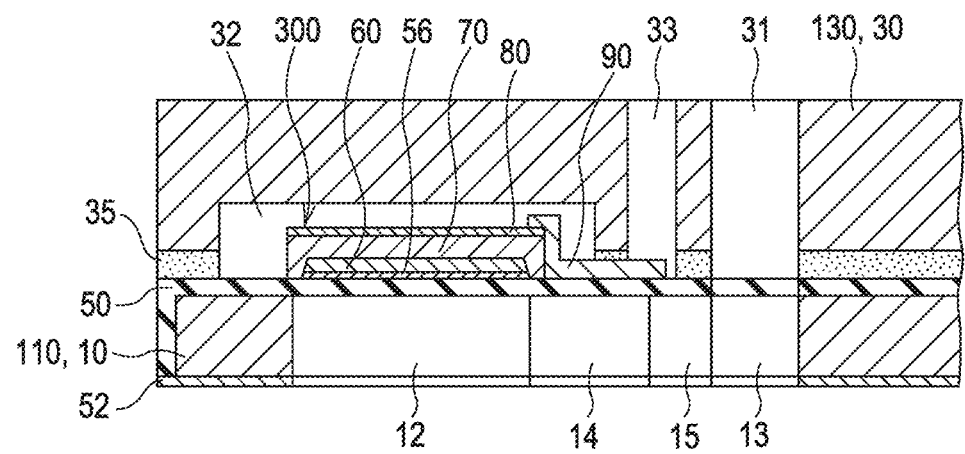
Figure 8:
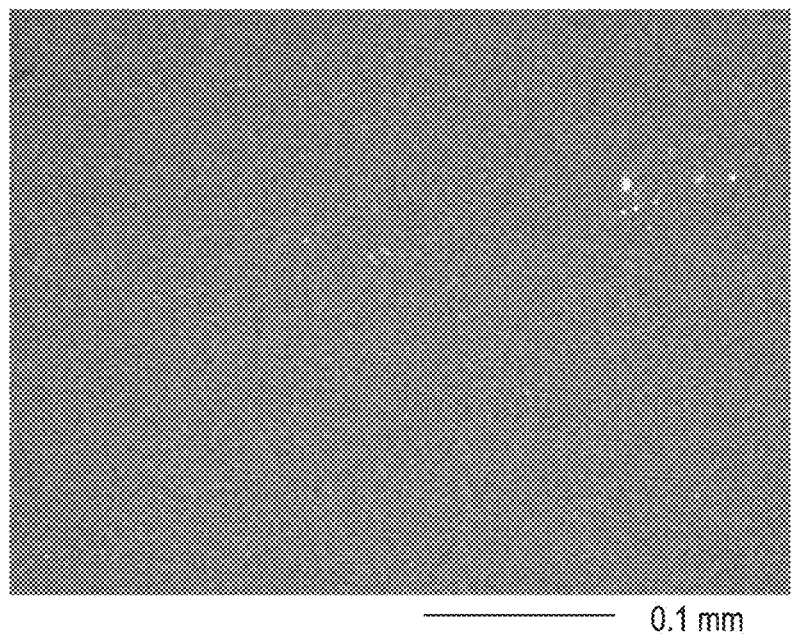
FIG. 8 is a photograph obtained by observation of the surface of a piezoelectric layer of Example 1 using a metallograph.
Figure 9:
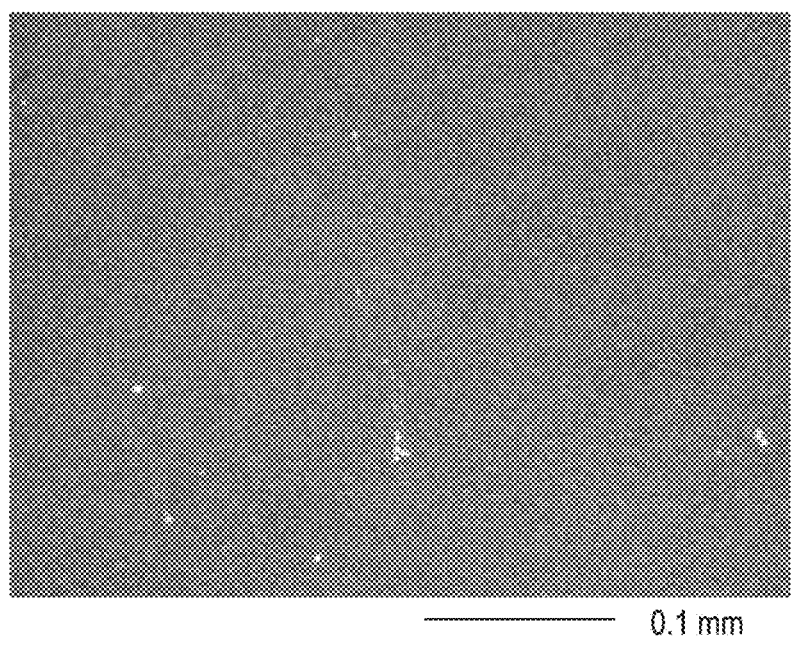
FIG. 9 is a photograph obtained by observation of the surface of a piezoelectric layer of Example 2 using a metallograph.
Figure 10:
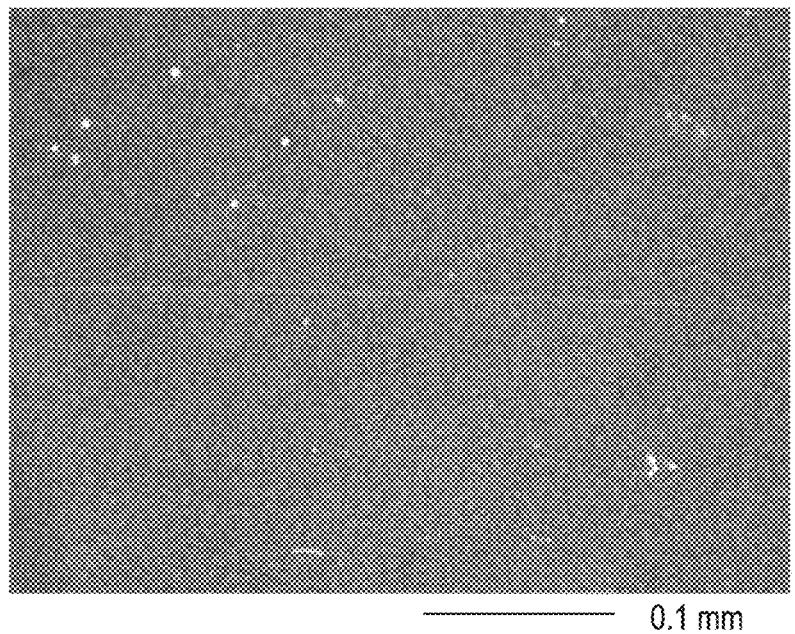
FIG. 10 is a photograph obtained by observation of the surface of a piezoelectric layer of Example 3 using a metallograph.
Figure 11:
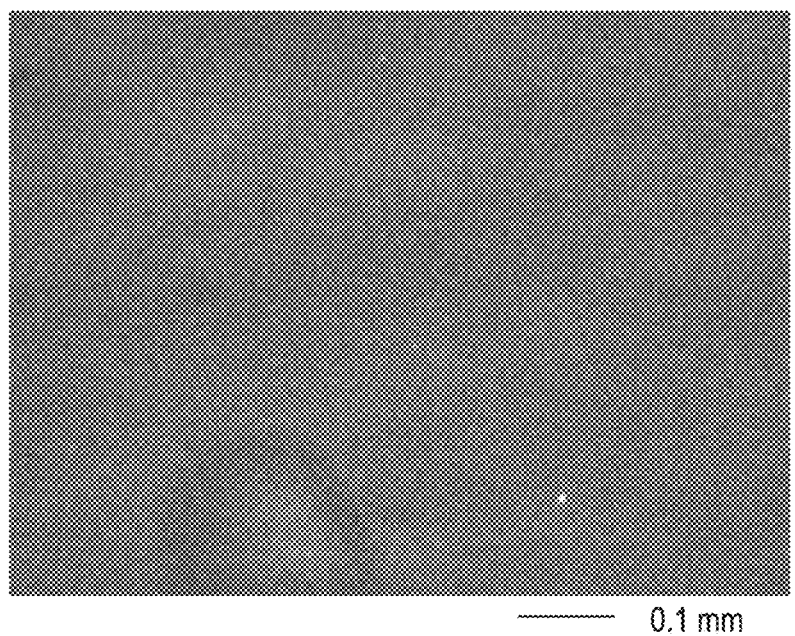
FIG. 11 is a photograph obtained by observation of the surface of a piezoelectric layer of Example 4 using a metallograph.

In addition, as shown in FIG. 7B, the pressure generating chamber 12 corresponding to the piezoelectric element 300, the communicating portion 13, the ink supply path 14, the communicating path 15, and the like are formed by performing anisotropic etching (wet etching) using an alkali solution such as KOH via the mask film 52 on the wafer 110 for the flow path forming substrate.

Thereafter, unnecessary parts of the outer peripheral edge portions of the wafer 110 for the flow path forming substrate and the wafer 130 for the protective substrate are removed by, for example, cutting away by dicing. In addition, after removing the mask film 52 on the surface of the wafer 110 for the flow path forming substrate on the opposite side to the wafer 130 for the protective substrate, the nozzle plate 20 having the nozzle openings 21 bored therethrough is bonded, the compliance substrate 40 is bonded to the wafer 130 for the protective substrate, and the wafer 110 for the flow path forming substrate and the like are divided into the flow path forming substrates 10 having a single chip size as shown in FIG. 1, thereby constituting the ink jet recording head I according to this embodiment.

Hereinafter, the invention will be described in more detail according to Examples. The invention is not limited to the following Examples.

Example 1

First, a silicon oxide ($SiO_2$) film having a thickness of 1070 nm was formed on the surface of a (110)-single-crystal silicon (Si) substrate by thermal oxidation. Next, a titanium film having a thickness of 20 nm was produced on the $SiO_2$ film by an RF magnetron sputtering method, and thermal oxidation was performed thereon at 700° C., thereby forming a titanium oxide film having a thickness of 40 nm. Next, a (111) plane-oriented platinum film (first electrode 60) having a thickness of 130 nm was formed on the titanium oxide film by a DC sputtering method.

Next, a piezoelectric layer 70 was formed on the first electrode 60 by a spin coating method. The method is as follows. First, an n-octane solution of bismuth 2-ethylhexanoate, iron 2-ethylhexanoate, barium 2-ethylhexanoate, titanium 2-ethylhexanoate, and nickel 2-ethylhexanoate was mixed at a molar ratio (Bi:Ba:Fe:Ti:Ni) of 75:25:75:25:5, thereby preparing a precursor solution.

The precursor solution was dripped on the substrate having the titanium oxide film and the platinum film formed thereon, and the substrate was rotated at 2500 rpm, thereby forming a piezoelectric precursor film (application process). Next, the substrate was dried at 180° C. for 2 minutes (drying process). Thereafter, degreasing was performed thereon at 400° C. for 2 minutes (degreasing process). Baking was performed at 700° C. for 5 minutes using a Rapid Thermal Annealing (RTA) apparatus in an oxygen atmosphere (baking process). Thereafter, a process in which the above-described application process, drying process, and degreasing process were repeated three times and then the baking process was performed was repeated three times, whereby the piezoelectric layer 70 was formed by the 10 total application processes. It is thought that the composition of the piezoelectric layer 70 is expressed as a stoichiometric equation ($Bi_{0.75}$, $Ba_{0.25}$)($Fe_{0.714}$, $Ti_{0.238}$, $Ni_{0.048}$).

Thereafter, a platinum film (second electrode 80) having a thickness of 100 nm was formed on the piezoelectric layer 70 as a second electrode 80 by a sputtering method, and then baking was performed thereon at 700° C. for 5 minutes using the RTA apparatus in an oxygen atmosphere, thereby forming a piezoelectric element 300 having the piezoelectric layer 70 having a thickness of 780 nm which is formed of a complex oxide having a perovskite structure which contains bismuth, iron, barium, titanium, and nickel.

Example 2

A piezoelectric element 300 was formed in the same manner as in Example 1, except that a precursor solution was prepared by mixing an n-octane solution of bismuth 2-ethylhexanoate, iron 2-ethylhexanoate, barium 2-ethylhexanoate, titanium 2-ethylhexanoate, and copper 2-ethylhexanoate at a molar ratio (Bi:Ba:Fe:Ti:Cu) of 75:25:75:25:5. It is thought that the composition of the piezoelectric layer 70 is expressed as a stoichiometric equation $(Bi_{0.75}, Ba_{0.25})(Fe_{0.714}, Ti_{0.238}, Cu_{0.048})$.

Example 3

A piezoelectric element 300 was formed in the same manner as in Example 1, except that a precursor solution was prepared by mixing an n-octane solution of bismuth 2-ethylhexanoate, iron 2-ethylhexanoate, barium 2-ethylhexanoate, titanium 2-ethylhexanoate, and zinc 2-ethylhexanoate at a molar ratio (Bi:Ba:Fe:Ti:Zn) of 75:25:75:25:5. It is thought that the composition of the piezoelectric layer 70 is expressed as a stoichiometric equation $(Bi_{0.75}, Ba_{0.25})(Fe_{0.714}, Ti_{0.238}, Zn_{0.048})$.

Example 4

A piezoelectric element 300 was formed in the same manner as in Example 1, except that a precursor solution was prepared by mixing an n-octane solution of bismuth 2-ethylhexanoate, iron 2-ethylhexanoate, barium 2-ethylhexanoate, titanium 2-ethylhexanoate, copper 2-ethylhexanoate and manganese 2-ethylhexanoate at a molar ratio (Bi:Ba:Fe:Ti:Cu:Mn) of 75:25:75:25:5:5. It is thought that the composition of the piezoelectric layer 70 is expressed as a stoichiometric equation $(Bi_{0.75}, Ba_{0.25})(Fe_{0.682}, Ti_{0.227}, Cu_{0.046}, Mn_{0.046})$.

Comparative Example 1

A piezoelectric element 300 was formed in the same manner as in Example 1, except that a precursor solution was prepared by mixing an n-octane solution of bismuth 2-ethylhexanoate, iron 2-ethylhexanoate, barium 2-ethylhexanoate, and titanium 2-ethylhexanoate at a molar ratio (Bi:Ba:Fe:Ti) of 75:25:75:25. It is thought that the composition of the piezoelectric layer 70 is expressed as a stoichiometric equation $(Bi_{0.75}, Ba_{0.25})(Fe_{0.75}, Ti_{0.25})$.

Comparative Example 2

A piezoelectric element 300 was formed in the same manner as in Example 1, except that a precursor solution was prepared by mixing an n-octane solution of bismuth 2-ethylhexanoate, iron 2-ethylhexanoate, barium 2-ethylhexanoate, titanium 2-ethylhexanoate, and vanadium 2-ethylhexanoate at a molar ratio (Bi:Ba:Fe:Ti:V) of 75:25:75:25:10. It is thought that the composition of the piezoelectric layer 70 is expressed as a stoichiometric equation $(Bi_{0.75}, Ba_{0.25})(Fe_{0.682}, Ti_{0.227}, V_{0.091})$.

Comparative Example 3

A piezoelectric element 300 was formed in the same manner as in Example 1, except that a precursor solution was prepared by mixing an n-octane solution of bismuth 2-ethylhexanoate, iron 2-ethylhexanoate, barium 2-ethylhexanoate, titanium 2-ethylhexanoate, and manganese 2-ethylhexanoate at a molar ratio (Bi:Ba:Fe:Ti:Mn) of 75:25:75:25:5. It is thought that the composition of the piezoelectric layer 70 is expressed as a stoichiometric equation $(Bi_{0.75}, Ba_{0.25})(Fe_{0.714}, Ti_{0.238}, Mn_{0.048})$.

Comparative Example 4

A piezoelectric element 300 was formed in the same manner as in Example 1, except that a precursor solution was prepared by mixing an n-octane solution of bismuth 2-ethylhexanoate, iron 2-ethylhexanoate, barium 2-ethylhexanoate, titanium 2-ethylhexanoate, and cobalt 2-ethylhexanoate at a molar ratio (Bi:Ba:Fe:Ti:Co) of 75:25:75:25:5. It is thought that the composition of the piezoelectric layer 70 is expressed as a stoichiometric equation $(Bi_{0.75}, Ba_{0.25})(Fe_{0.714}, Ti_{0.238}, Co_{0.048})$.

Test Example 1

In Examples 1 to 4 and Comparative Examples 1 to 4, whether or not cracks were caused after a lapse of 1 day from the formation of the piezoelectric layer 70 was confirmed for the piezoelectric layer 70 in a state in which the second electrode 80 was not formed. The surface of the piezoelectric layer was observed using a 500-power metallograph (BX60 dark field; manufactured by Olympus Corporation). As an example of the results, the results of Examples 1 to 4 are shown in FIGS. 8 to 11, and the result of Comparative Example 1 is shown in FIG. 12.

Figure 12:
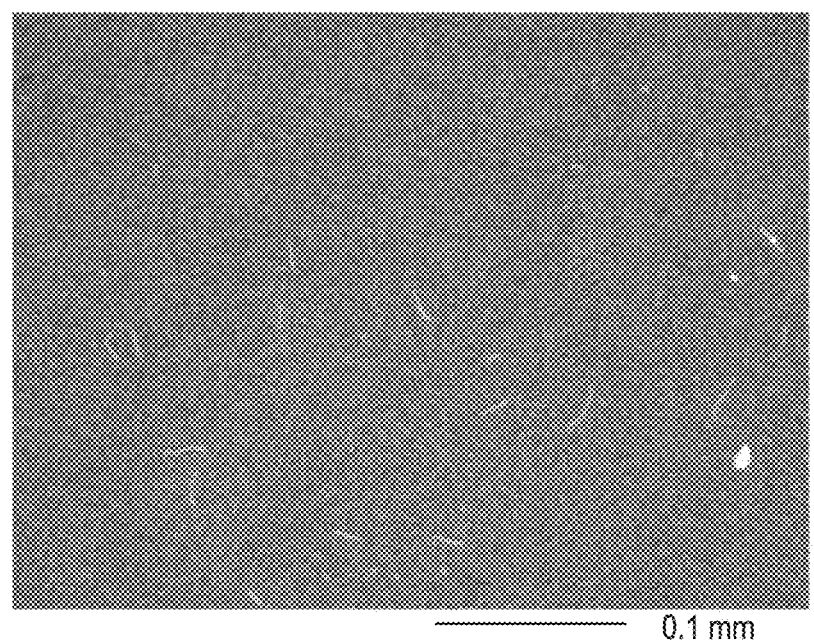
FIG. 12 is a photograph obtained by observation of the surface of a piezoelectric layer of Comparative Example 1 using a metallograph.

As shown in FIGS. 8 to 11, no cracks were caused in the piezoelectric layers 70 of Examples 1 to 4, as compared to the case in which cracks were caused in Comparative Example 1 as shown in FIG. 12. In addition, cracks were caused in the piezoelectric layers 70 of Comparative Examples 2 to 4 in which the metal elements other than nickel, copper, and zinc were added.

Accordingly, it was confirmed that cracks were suppressed from being caused in the piezoelectric layers 70 of Examples 1 to 4.

Test Example 2

In Examples 1 to 3 and Comparative Examples 1 to 4, X-ray diffraction was performed on the piezoelectric layer 70 in a state in which the second electrode 80 was not formed, thereby measuring residual stress using a $2\theta$-$\sin^2\phi$ drawing. The results are shown in FIG. 13.

Figure 13:
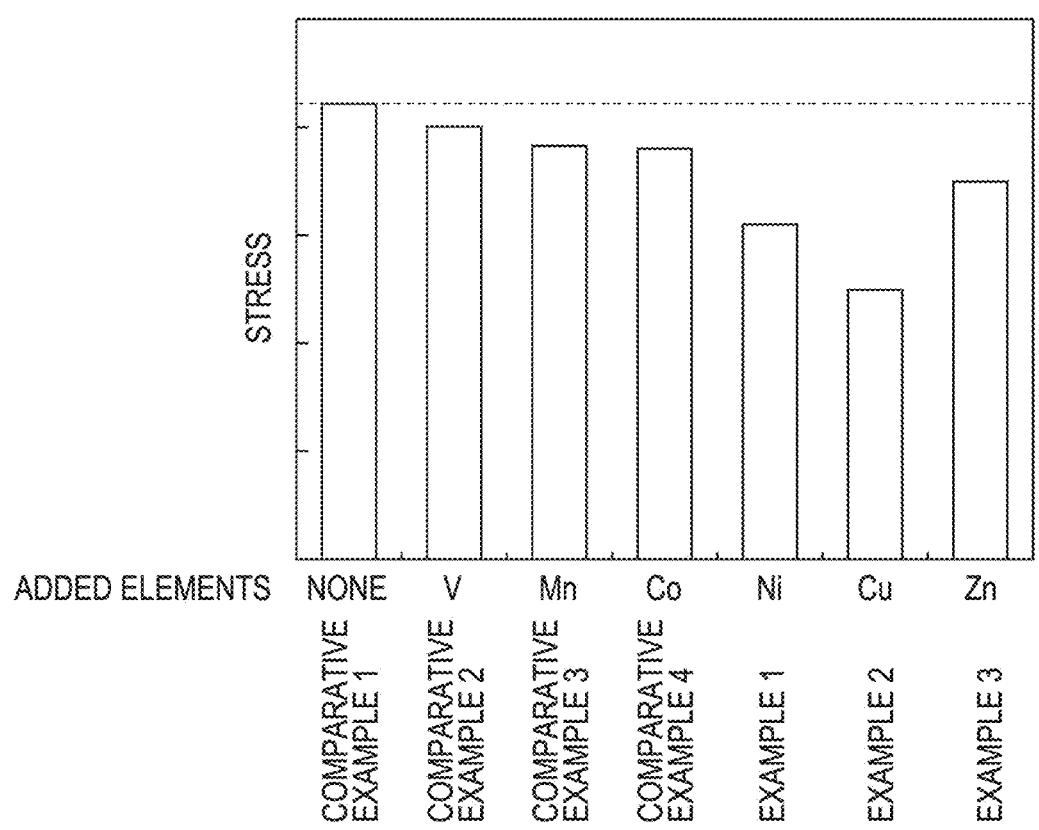
FIG. 13 is a diagram illustrating the residual stresses of the piezoelectric layers of Examples and Comparative Examples.

As shown in FIG. 13, it was found that the residual stress was significantly reduced in the piezoelectric layers 70 of Examples 1 to 3 in which Ni, Cu, and Zn were added to the complex oxides represented as mixed crystals of bismuth ferrate and barium titanate, respectively, as compared to the case of Comparative Example 1 in which the piezoelectric layers 70 was formed of the complex oxide represented as mixed crystals of bismuth ferrate and barium titanate. The reduction in stress in the piezoelectric layers 70 of Comparative Examples 2 to 4 in which other metal elements were added was confirmed and it was smaller than that of the piezoelectric layers of Examples 1 to 3.

Accordingly, it is thought that since the piezoelectric layer is formed of a complex oxide having at least one of Ni, Cu, and Zn added thereto, the residual stress is reduced and cracks are thus suppressed from being caused.

Test Example 3

Figure 14:
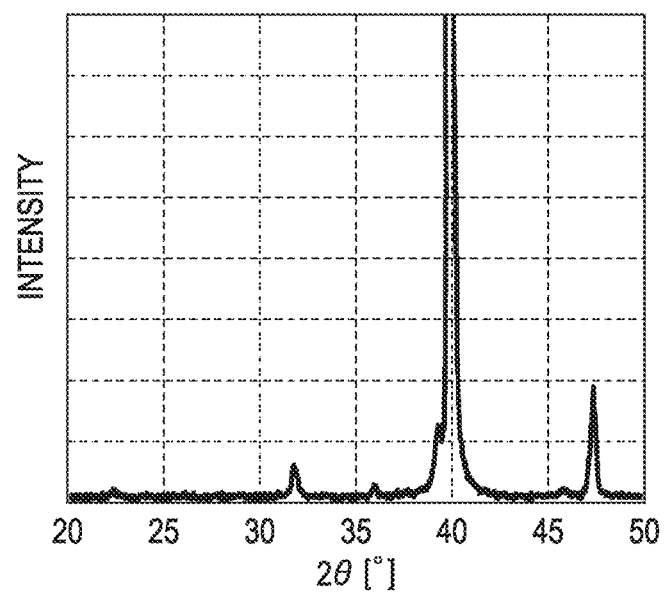
FIG. 14 is a graph illustrating a XRD measurement result of Example 1.
Figure 15:
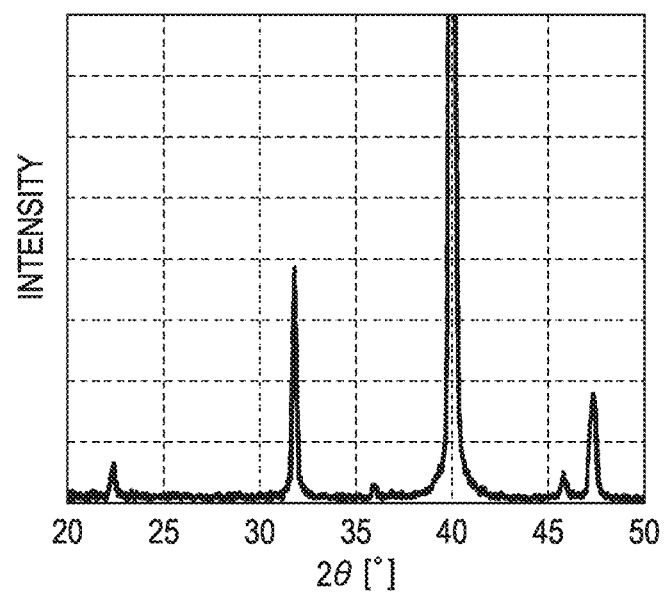
FIG. 15 is a graph illustrating a XRD measurement result of Example 2.
Figure 16:
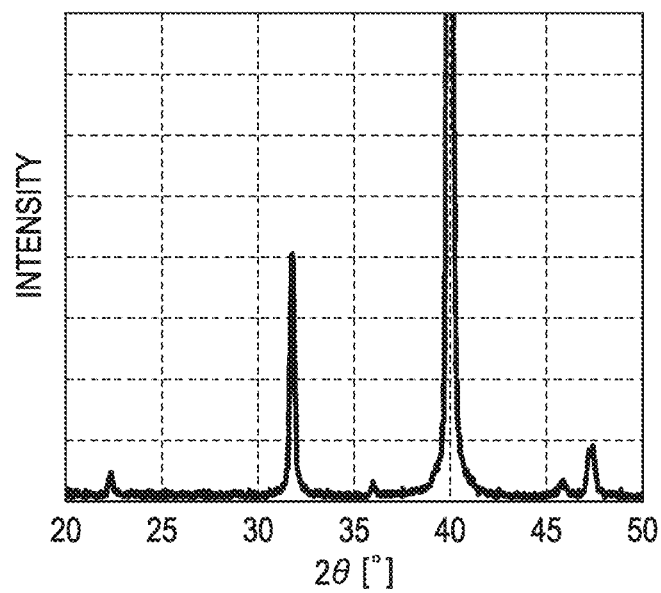
FIG. 16 is a graph illustrating a XRD measurement result of Example 3.
Figure 17:
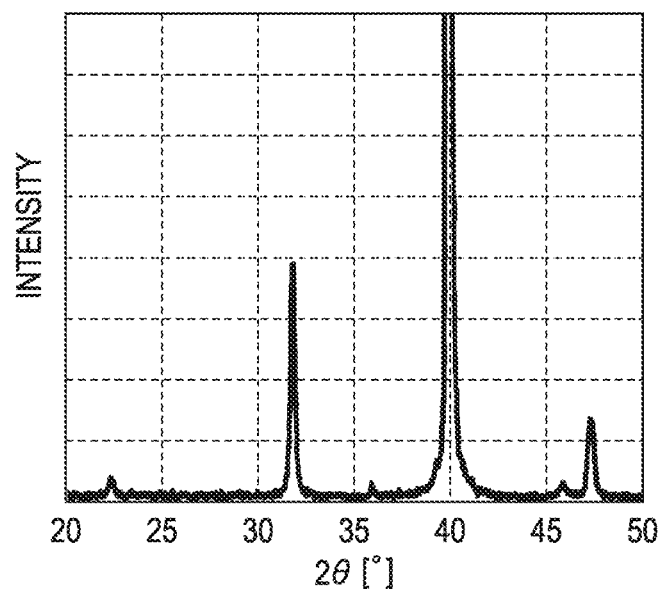
FIG. 17 is a graph illustrating a XRD measurement result of Comparative Example 1.

From the piezoelectric elements of Examples 1 to 4 and Comparative Examples 1 to 4, the X-ray diffraction pattern of the piezoelectric layer 70 was obtained at room temperature (25° C.) using "D8 Discover" manufactured by Bruker AXS and using CuKα-rays as an X-ray source. As an example of the results, the results of Examples 1 to 3 are shown in FIGS. 14 to 16, and the result of Comparative Example 1 is shown in FIG. 17.

As a result, in all of Examples 1 to 4 and Comparative Examples 1 to 4, the peak caused by the perovskite structure of the piezoelectric layer and the peak caused by the substrate were observed. In addition, in all of Examples 1 to 4 and Comparative Examples 1 to 4, bismuth ferrate and barium titanate were not independently detected.

Test Example 4

Figure 18:
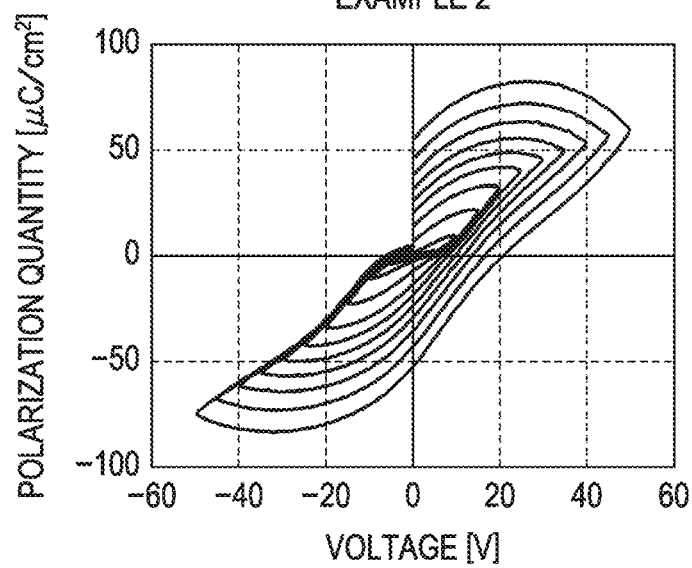
FIG. 18 is a diagram illustrating the relationship between a polarization quantity and a voltage of Example 2.
Figure 19:
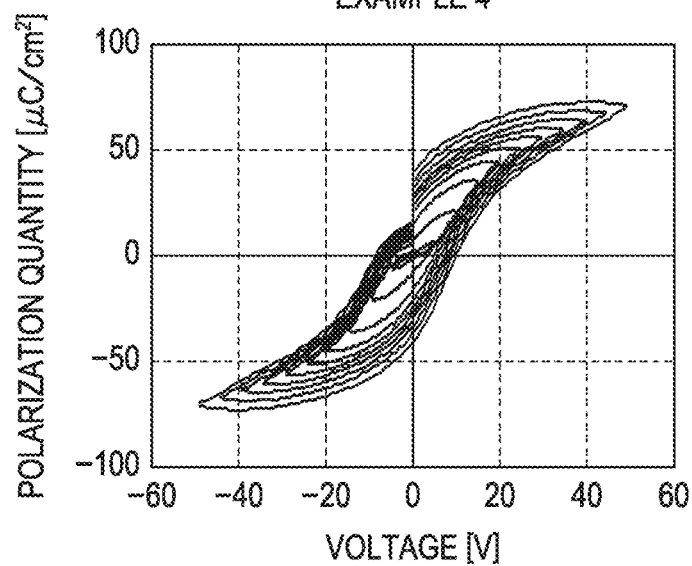
FIG. 19 is a diagram illustrating the relationship between a polarization quantity and a voltage of Example 4.

Triangle waves of a frequency of 1 kHz were applied to the piezoelectric elements of Examples 2 and 4 at room temperature using "FCE-1A" manufactured by Toyo Corporation and using an electrode pattern of $\phi=400$ μm, whereby a relationship (P-E curve) between the polarization quantity and the electric field was obtained. The result of Example 2 is shown in FIG. 18, and the result of Example 4 is shown in FIG. 19.

As a result, the polarization quantity in the case of Example 4 was greater than that in the case of Example 2. Accordingly, it was confirmed that Example 4 had more excellent insulating properties than Example 2.

Other Embodiments

Although one embodiment of the invention has been described as above, the basic configuration of the invention is not limited to the above description. For example, in the above-described embodiments, the single-crystal silicon substrate has been exemplified as the flow path forming substrate 10. However, the invention is not particularly limited thereto, and for example, a material such as an SOI substrate or glass may be used.

Furthermore, in the above-described embodiments, the piezoelectric element 300 in which the first electrode 60, the piezoelectric layer 70, and the second electrode 80 are sequentially laminated on the substrate (flow path forming substrate 10) has been exemplified. However, the invention is not particularly limited thereto, and for example, the invention can also be applied to a longitudinal oscillation-type piezoelectric element in which a piezoelectric material and an electrode forming material are alternately laminated to be expanded or contracted in the axial direction.

Figure 20:
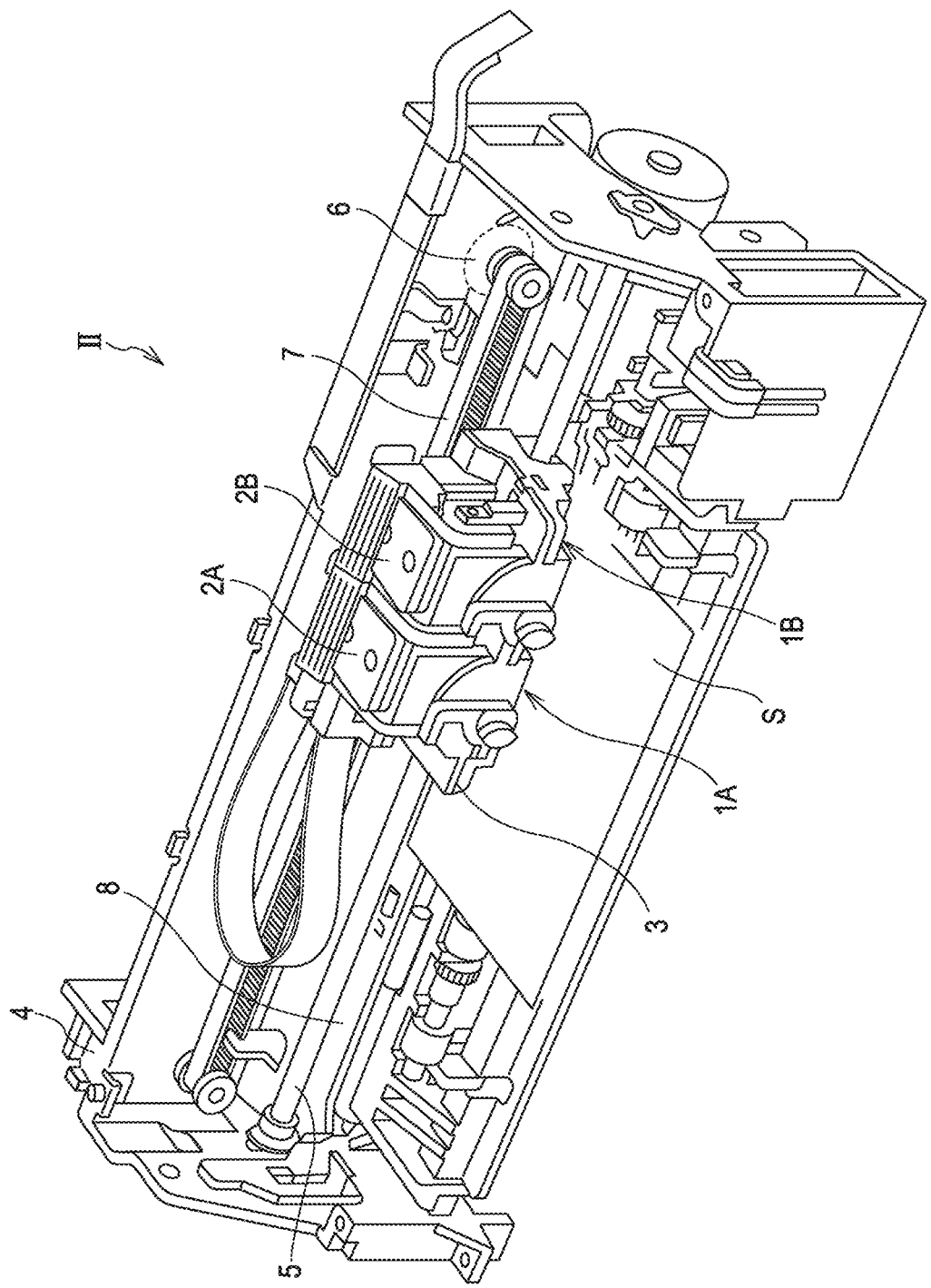
FIG. 20 is a diagram schematically illustrating the configuration of a recording apparatus according to an embodiment of the invention.

In addition, the ink jet recording head of these embodiments constitutes a part of a recording head unit which is provided with an ink flow path communicating with an ink cartridge or the like, and is mounted on an ink jet recording apparatus. FIG. 20 is a schematic diagram illustrating an example of the ink jet recording apparatus.

In an ink jet recording apparatus II shown in FIG. 20, cartridges 2A and 2B which are used to constitute an ink supplier are detachably provided in recording head units 1A and 1B having the ink jet recording head I, and a carriage 3 on which the recording head units 1A and 1B are mounted is provided on a carriage shaft 5 attached to an apparatus body 4 so as to freely move in the axial direction. The recording head units 1A and 1B respectively discharge, for example, a black ink composition and a color ink composition.

In addition, a driving force of a driving motor 6 is transmitted to the carriage 3 via a plurality of gears (not shown) and a timing belt 7, and thus the carriage 3 on which the recording head units 1A and 1B are mounted is moved along the carriage shaft 5. A platen 8 is provided in the apparatus body 4 along the carriage shaft 5, and a recording sheet S which is a recording medium such as paper fed from a feeding roller (not shown) or the like is wound around the platen 8 and transported.

In the above-described embodiments, the ink jet recording head has been described as an example of a liquid ejecting head. However, the invention is widely applied to general liquid ejecting heads, and can also be applied to liquid ejecting heads which eject a liquid other than ink. Examples of other liquid ejecting heads include various recording heads which are used in an image recording apparatus such as a printer, color material ejecting heads which are used for manufacturing of a color filter of a liquid crystal display or the like, electrode material ejecting heads which are used for formation of an electrode of an organic EL display, a field emission display (FED), or the like, and biological organic material ejecting heads which are used for manufacturing of biochips.

In addition, the invention is not limited to the piezoelectric element which is used in a liquid ejecting head, and can also be used for other devices, e.g., ultrasonic devices such as ultrasonic transmitters, ultrasonic motors, temperature-electricity converters, pressure-electricity converters, ferroelectric transistors, piezoelectric transformers, and filters such as blocking filters for harmful rays such as infrared rays, optical filters using a photonic crystal effect due to the formation of quantum dots, and optical filters using optical interference of a thin film. In addition, the invention can also be applied to piezoelectric elements which are used as sensors and piezoelectric elements which are used as ferroelectric memories. Examples of the sensor in which the piezoelectric element is used include infrared sensors, ultrasonic sensors, heat-sensitive sensors, pressure sensors, pyroelectric sensors, and gyro sensors (angular velocity sensors).

In the above-described embodiments, the first electrode 60 made of platinum, iridium, iridium oxide, or having a lamination structure thereof and the second electrode 80 made of platinum have been exemplified as an electrode constituting the piezoelectric element. However, the invention is not limited thereto. For example, the electrode may be made of platinum, iridium, gold, titanium, zirconium, iron, manganese, nickel, cobalt, iridium oxide, niobium-doped strontium titanate ($Nb:SrTiO_3$), lanthanum-doped strontium titanate ($La:SrTiO_3$), strontium ruthenate ($SrRuO_3$), lanthanum nickelate ($LaNiO_3$), lanthanum strontium ferrate (($La,Sr)FeO_3$), lanthanum strontium cobalate (($La,Sr)CoO_3$), or have a lamination structure thereof.

In addition, the substrate which is provided with the piezoelectric layer and the electrode constituting the piezoelectric element is not particularly limited, and made of any of a semiconductor material, a metallic material, a ceramic material, and a glass material. However, it is preferable that the melting point of the material of the substrate is 650° C. or higher, and when considering a glass-transition temperature, it is preferable that the melting point and the glass-transition temperature are 650° C. or higher.

What is claimed is:

1. A liquid ejecting head which discharges a liquid from nozzle openings, comprising:
    a piezoelectric element which is provided with a piezoelectric layer and an electrode provided on the piezoelectric layer,
    wherein the piezoelectric layer is formed of a complex oxide having a perovskite structure which contains bismuth, iron, barium, titanium, and at least one selected from the group consisting of copper, nickel, and zinc.

2. The liquid ejecting head according to claim 1, wherein the complex oxide contains bismuth, iron, barium, titanium, copper, and manganese.

3. A liquid ejecting apparatus comprising:
the liquid ejecting head according to claim 2.

4. A liquid ejecting apparatus comprising:
the liquid ejecting head according to claim 1.

5. A piezoelectric element comprising:
a piezoelectric layer; and
an electrode which is provided on the piezoelectric layer, wherein the piezoelectric layer is formed of a complex oxide having a perovskite structure which contains bismuth, iron, barium, titanium, and at least one selected from the group consisting of copper, nickel, and zinc.

* * * * *